US009842900B2

(12) United States Patent
Reznicek

(10) Patent No.: US 9,842,900 B2
(45) Date of Patent: Dec. 12, 2017

(54) GRADED BUFFER LAYERS WITH LATTICE MATCHED EPITAXIAL OXIDE INTERLAYERS

(71) Applicant: International Business Machines Corporation, Armonk, NY (US)

(72) Inventor: Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/085,022

(22) Filed: Mar. 30, 2016

(65) Prior Publication Data

US 2017/0288024 A1 Oct. 5, 2017

(51) Int. Cl.

| | |
|---|---|
| ***H01L 29/12*** | (2006.01) |
| ***H01L 31/055*** | (2014.01) |
| ***H01L 31/028*** | (2006.01) |
| ***H01L 21/84*** | (2006.01) |
| ***H01L 21/20*** | (2006.01) |
| ***H01L 21/762*** | (2006.01) |
| ***H01L 29/32*** | (2006.01) |
| ***H01L 29/205*** | (2006.01) |
| ***H01L 29/06*** | (2006.01) |
| ***H01L 21/02*** | (2006.01) |

(52) U.S. Cl.

CPC .......... *H01L 29/32* (2013.01); *H01L 21/0245* (2013.01); *H01L 21/02554* (2013.01); *H01L 29/0607* (2013.01); *H01L 29/205* (2013.01)

(58) Field of Classification Search

CPC ......... H01L 21/02381; H01L 21/02422; H01L 21/0245; H01L 21/02488; H01L 21/02502; H01L 21/02532

USPC ......... 257/64, 76, 94, 43; 438/149, 496, 778

See application file for complete search history.

(56) References Cited

U.S. PATENT DOCUMENTS

| | | | |
|---|---|---|---|
| 6,610,548 | B1 | 8/2003 | Ami et al. |
| 6,852,575 | B2 | 2/2005 | Bojarczuk, Jr. et al. |
| 7,135,699 | B1 | 11/2006 | Atanackovic |
| 7,214,598 | B2 | 5/2007 | Capewell et al. |
| 7,785,995 | B2 | 8/2010 | Cody et al. |
| 7,902,046 | B2 | 3/2011 | Kuo et al. |
| 8,530,935 | B2 | 9/2013 | Yanagihara |
| 8,846,504 | B1 | 9/2014 | Dargis et al. |
| 9,111,839 | B2 | 8/2015 | Hoteida et al. |

(Continued)

FOREIGN PATENT DOCUMENTS

| | | |
|---|---|---|
| JP | 5576114 | 7/2014 |

*Primary Examiner* — Duy T Nguyen

*Assistant Examiner* — Brian Turner

(74) *Attorney, Agent, or Firm* — Scully, Scott, Murphy & Presser, P.C.; Daniel P. Morris, Esq.

(57) ABSTRACT

A lattice matched epitaxial oxide interlayer is disposed between each semiconductor layer of a graded buffer layer material stack. Each lattice matched epitaxial oxide interlayer inhibits propagation of threading dislocations from one semiconductor layer of the graded buffer layer material stack into an overlying semiconductor layer of the graded buffer layer material stack. This allows for decreasing the thickness of each semiconductor layer within the graded buffer layer material stack. The topmost semiconductor layer of the graded buffer layer material stack, which is a relaxed layer, contains a lower defect density than the other semiconductor layers of the graded buffer layer material stack.

18 Claims, 1 Drawing Sheet

14F
16E
14E
16D
14D
16C
14C
16B
14B
16A
14A
10
12
20
18

(56) References Cited

U.S. PATENT DOCUMENTS

| | | | | |
|---|---|---|---|---|
| 2005/0095815 | A1* | 5/2005 | Bojarczuk, Jr. | B82Y 10/00 438/459 |
| 2010/0038521 | A1* | 2/2010 | Clark | B82Y 20/00 250/208.6 |
| 2012/0256232 | A1* | 10/2012 | Clark | H01L 21/02381 257/190 |
| 2013/0001645 | A1 | 1/2013 | Kakuta et al. | |
| 2013/0221326 | A1 | 8/2013 | Alberi et al. | |
| 2013/0295733 | A1 | 11/2013 | Wang et al. | |
| 2014/0353587 | A1 | 12/2014 | Hoteida et al. | |
| 2016/0118255 | A1* | 4/2016 | Qi | H01L 21/0245 438/479 |

* cited by examiner

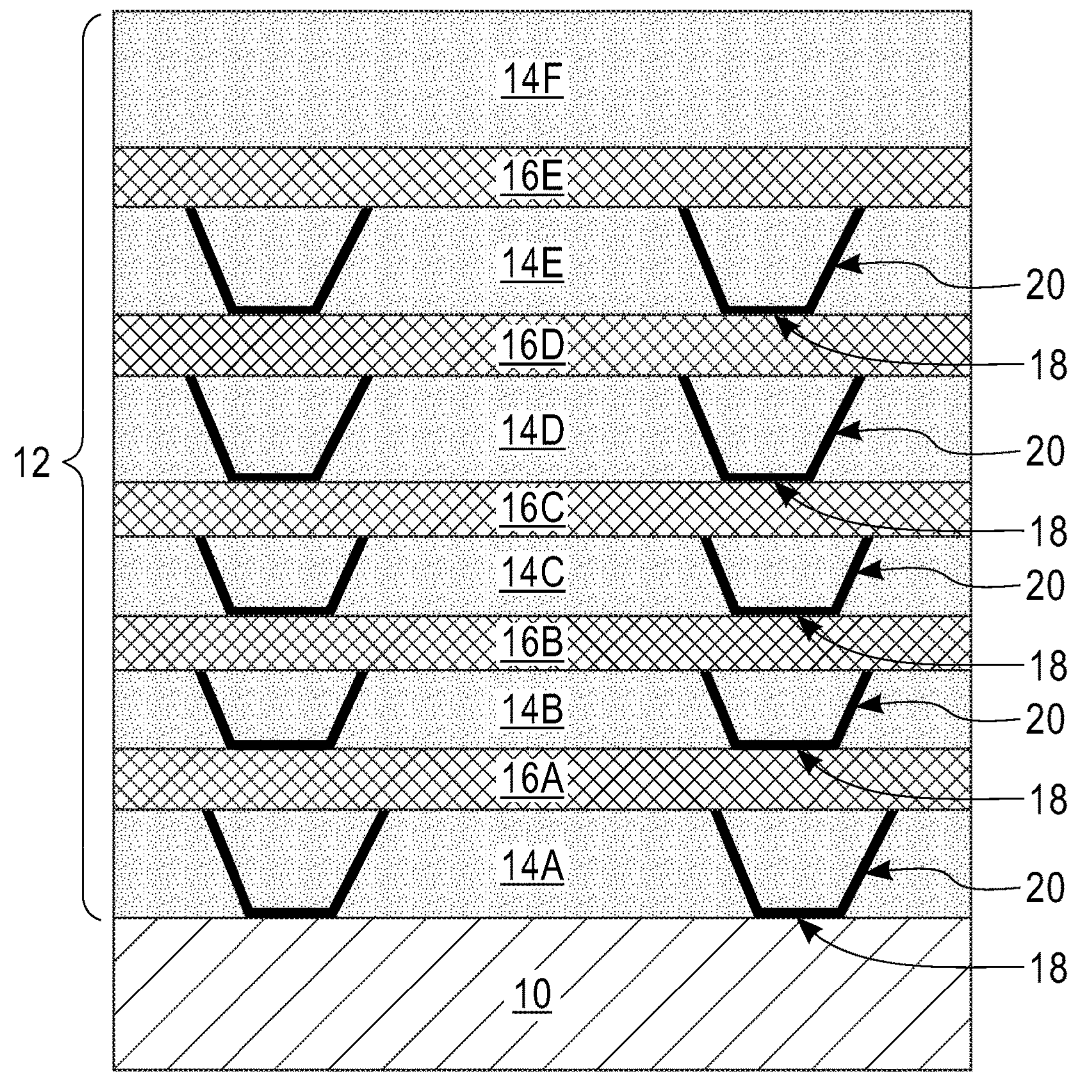
14F
16E
14E
20
18
16D
14D
20
18
16C
14C
20
18
16B
14B
20
18
16A
14A
20
18
12
10

GRADED BUFFER LAYERS WITH LATTICE MATCHED EPITAXIAL OXIDE INTERLAYERS

BACKGROUND

The present application relates to a semiconductor structure and a method of forming the same. More particularly, the present application relates to a semiconductor structure containing a graded buffer layer material stack in which a lattice matched epitaxial oxide interlayer is disposed between each semiconductor layer of the graded buffer layer material stack.

Graded buffer layers (GBLs), also referred to as strain relaxed buffer layers (SRBs), are currently one of the front up approaches for 7 nm node and beyond technologies, enabling, for instance, dual channel material FinFETs in the same substrate. As an example, a topmost silicon germanium alloy (i.e., SiGe) of a GBL can be used for growing tensily-strained silicon (Si) channels for n-channel field effect transistors (i.e., nFETs), and compressively-stained germanium or high-germanium percentage SiGe channels for p-channel field effect transistors (i.e., pFETs).

One of the biggest challenges with the process device yields of conventional GBLs is that the defect density at the surface of the GBL is in the $1\times10^5$ range even for the best known structures. This level of defect density is far too high to achieve high performance CMOS fabrication. As such, a method is needed in which GBLs can be formed in which the defect density at the surface of each GBL is reduced to allow the GBLs to be employed in high performance CMOS fabrication.

SUMMARY

A lattice matched epitaxial oxide interlayer is disposed between each semiconductor layer of a graded buffer layer material stack. Each lattice matched epitaxial oxide interlayer inhibits propagation of threading dislocations from one of the semiconductor layers of the graded buffer layer material stack into an overlying semiconductor layer of the graded buffer layer material stack. This allows for decreasing the thickness of each semiconductor layer within the graded buffer layer material stack. The topmost semiconductor layer of the graded buffer layer material stack, which is a relaxed layer, contains a lower defect density than the other semiconductor layers of the graded buffer layer material stack.

One aspect of the present application relates to a semiconductor structure. In one embodiment of the present application, the semiconductor structure includes a graded buffer layer material stack located on a surface of a semiconductor substrate, wherein a lattice matched epitaxial oxide interlayer is disposed between each semiconductor layer of the graded buffer layer material stack.

Another aspect of the present application relates to a method of forming a semiconductor structure. In one embodiment of the present application, the method includes forming a graded buffer layer material stack on a surface of a semiconductor substrate, wherein a lattice matched epitaxial oxide interlayer is disposed between each semiconductor layer of the graded buffer layer material stack.

BRIEF DESCRIPTION OF SEVERAL VIEWS OF THE DRAWINGS

The sole FIGURE is a cross sectional view of an exemplary semiconductor structure of the present application including a graded buffer layer material stack located on a surface of a semiconductor substrate, wherein a lattice matched epitaxial oxide interlayer is disposed between each semiconductor layer of the graded buffer layer material stack.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being “on” or “over” another element, it can be directly on the other element or intervening elements may also be present. In contrast, when an element is referred to as being “directly on” or “directly over” another element, there are no intervening elements present. It will also be understood that when an element is referred to as being “beneath” or “under” another element, it can be directly beneath or under the other element, or intervening elements may be present. In contrast, when an element is referred to as being “directly beneath” or “directly under” another element, there are no intervening elements present.

Referring to the sole FIGURE of the present application, there is illustrated an exemplary semiconductor structure of the present application. The exemplary semiconductor structure of the sole FIGURE of the present application includes a graded buffer layer material stack 12 located on a surface of a semiconductor substrate 10, wherein a lattice matched epitaxial oxide interlayer (16A, 16B, 16C, 16D, 16E, etc.) is disposed between each semiconductor layer (14A, 14B, 14C, 14D, 14E, 14F, etc.) of the graded buffer layer material stack 12.

In the embodiment illustrated, the graded buffer layer material stack 12 includes six semiconductor layers (14A, 14B, 14C, 14D, 14E, and 14F) and five lattice matched oxide interlayers (16A, 16B, 16C, 16D, and 16E). The graded buffer layer material stack 12 of the present application is not limited to the number of semiconductor layers and lattice matched epitaxial oxide interlayers shown in the sole FIGURE of the present application. Instead, the graded buffer layer material stack 12 of the present may include any number of semiconductor layers and any number of lattice matched epitaxial oxide interlayers so long as a lattice matched epitaxial oxide interlayer is sandwiched between each semiconductor layer. As a general rule, the graded buffer layer material stack 12 of the present may include 2n numbers of semiconductor layers and n numbers of lattice matched epitaxial oxide interlayers wherein n is at least 1.

The semiconductor substrate 10 that is located beneath the graded buffer layer material stack 12 of the present application includes at least an upper portion that includes a first semiconductor material having a first lattice constant. The first semiconductor material that can provide at least the upper portion of the semiconductor substrate 10 includes any semiconductor material having semiconducting properties. Examples of semiconductor materials that may be employed as the first semiconductor material that can provide at least the upper portion of the semiconductor substrate 10 include, but are not limited to, silicon (Si), germanium (Ge), silicon germanium alloys (SiGe), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

In one embodiment, the entirety of the semiconductor substrate 10 is composed of the first semiconductor material. In another embodiment, other semiconductor materials can be located beneath the first semiconductor material that provides an upper portion of the semiconductor substrate 10. In yet a further embodiment, the first semiconductor material that provides an upper portion of the semiconductor substrate 10 is located upon a buried insulator layer of a semiconductor-on-insulator (SOI) substrate.

Each of the semiconductor layers (14A, 14B, 14C, 14D, 14E, 14F, etc.) of the graded buffer layer material stack 12 is composed of a second semiconductor material having a second lattice constant that differs from the first lattice constant of the first semiconductor material mentioned above for the semiconductor substrate 10. In one embodiment, the second lattice constant is greater than the first lattice constant. In another embodiment, the second lattice constant is less than the first lattice constant.

In one embodiment of the present application, each of the semiconductor layers (14A, 14B, 14C, 14D, 14E, 14F, etc.) of the graded buffer layer material stack 12 may be composed of a silicon germanium alloy. In such an embodiment, the graded buffer layer material stack 12 containing the silicon germanium alloy may be step graded. In this embodiment, the term "step graded" denotes that the content of germanium within the silicon germanium alloy containing graded buffer layer material stack 12 increases in a non-abrupt manner upward from the interface with the semiconductor substrate 10. In one example, the semiconductor layer 14A may have a germanium content of from 4 atomic percent germanium to 5 atomic percent germanium, the semiconductor layer 14B may have a germanium content of from 8 atomic percent germanium to 10 atomic percent germanium, the semiconductor layer 14C may have a germanium content of 12 atomic percent germanium to 14 atomic percent germanium, the semiconductor layer 14D may have a germanium content of 16 atomic percent germanium to 18 atomic percent germanium, and semiconductor layer 14E and 14F may have a germanium content from 20 atomic percent germanium to 24 atomic percent germanium. Although this specific example is provided, the present application is not limited to the same.

In another embodiment of the present application, each of the semiconductor layers (14A, 14B, 14C, 14D, 14E, 14F, etc.) of the graded buffer layer material stack 12 may be composed of a III-V compound semiconductor material. In such an embodiment, the graded buffer layer material stack 12 containing the III-V compound semiconductor may be step graded. In this embodiment, the term "step graded" denotes that the content of the Group V element within the III-V compound semiconductor material containing graded buffer layer material stack 12 increases in a non-abrupt manner upward from the interface with the semiconductor substrate 10.

After formation of the entire graded buffer layer material stack 12, each of the semiconductor layers (14A, 14B, 14C, 14D, 14E, 14F, etc.) of the graded buffer layer material stack 12 is a relaxed layer; during growth of the low percentages semiconductor layers (e.g., silicon germanium alloy layer containing less than 12 atomic percent germanium), the low percentage semiconductor layers will be strained. Each of the latticed mismatched semiconductor layers of the graded buffer layer material 12 will contain misfit dislocations located within a bottom portion of semiconductor layer of the graded buffer layer material stack. Each of the misfit dislocation defects contains threading dislocation defects that extend upward to the topmost surface of each of the semiconductor layers within the graded buffer layer material 12.

The presence of the aforementioned defects is also shown in the sole FIGURE of the present application. Notably, the sole FIGURE of the present application illustrates misfit dislocation defects 18 and threading dislocation defects 20 present in the semiconductor layers 14A, 14B, 14C, 14D and 14E of the graded buffer layer material stack 12 that is located beneath the topmost semiconductor layer 14F of the graded buffer layer material stack 12.

In the present application, the threading dislocation defects are prevented from extending to the topmost semiconductor layer, i.e., 14F shown in the sole FIGURE of the present application by way of an example, by forming lattice matched epitaxial oxide interlayers (16A, 16B, 16C, 16D, 16E, etc.) between each semiconductor layer (i.e., 14A, 14B. 14C, 14D, and 14E) of the graded buffer layer material stack 12. By "lattice matched" it is meant the epitaxial oxide matches the lattice constant of the underlying semiconductor layer of the graded buffer layer material stack 12 of the present application. Typically, and in order for latticing matching with the underlying semiconductor, the lattice matched epitaxial oxide interlayer has a lattice constant twice the lattice constant of the semiconductor layers of the graded buffer layer material stack 12. In the present application, the topmost semiconductor layer (e.g., semiconductor layer 14F) of the graded buffer layer material stack 12 has a lower defect density than the other semiconductor layers (i.e., 14A, 14B. 14C, 14D, and 14E) of the graded buffer layer material stack 12.

Each of the lattice matched epitaxial oxide interlayers (16A, 16B, 16C, 16D, 16E, etc.) is composed of an oxide of at least one rare earth metal. Rare earth metals that can be used herein as a component of the lattice matched epitaxial oxide interlayers include scandium, yttrium, a lanthanide (i.e., La, Ce, Pr, Nd, Pm, Sm, Eu, Gd, Tb, Dy, Ho, Er, Tm, Yb, and Lu), or any combination thereof.

In one embodiment, the oxide of at least one rare earth metal that may provide each lattice matched epitaxial oxide interlayer is a binary compound. In another embodiment, the oxide of at least one rare earth metal that may provide each lattice matched epitaxial oxide interlayer is a ternary compound. Examples of oxides of at least one rare earth metal that can be used to provide the lattice matched epitaxial oxide interlayers (16A, 16B, 16C, 16D, 16E, etc.) include, but are not limited to $(La_xY_{1-x})_2O_3$ wherein x is from 0.33 to 0.46, $Gd_2O_3$, $Er_2O_3$, $Dy_2O_3$, $Ho_2O_3$, $Tm_2O_3$, $Lu_2O_3$ and $CeO_2$. In addition to $(La_xY_{1-x})_2O_3$, other ternary compounds having the formula $(RE^1_xRE^2_{1-x})_2O_3$ wherein $RE^1$ is a first rare earth metal and $RE^2$ is a second rare earth metal that differs from the first rare earth metal can be used.

Each of the lattice matched epitaxial oxide interlayers (16A, 16B, 16C, 16D, 16E, etc.) may have a thickness from 5 nm to 25 nm. Other thickness that are lesser than or greater than the aforementioned thickness range may also be used as the thickness of each of the lattice matched epitaxial oxide interlayers (16A, 16B, 16C, 16D, 16E, etc.).

Without wishing to be bound by any theory, it is believed that the lattice matched epitaxial oxide interlayers (16A, 16B, 16C, 16D, 16E, etc.) of the present application inhibit propagation of threading dislocation defects because of different atomic radii, different unit cell and different bonding types (polar vs. covalent) and bonding energies between the rare earth oxide and the second semiconductor material that provides each semiconductor layer of the graded buffer layer material stack 12.

The graded buffer layer material stack 12 shown in the sole FIGURE of the present application can be formed utilizing an epitaxial growth process to form each of the semiconductor layers and each of the lattice matched epitaxial oxide interlayers that provide the graded buffer layer material stack 12.

The terms "epitaxial growth and/or deposition" and "epitaxially formed and/or grown" mean the growth of a material on a deposition surface of a material, in which the material being grown has the same crystalline characteristics as the material of the deposition surface. In an epitaxial deposition process, the chemical reactants provided by the source gases are controlled and the system parameters are set so that the depositing atoms arrive at the deposition surface of the growth surface with sufficient energy to move around on the surface and orient themselves to the crystal arrangement of the atoms of the deposition surface. Therefore, an epitaxial material has the same crystalline characteristics as the deposition surface on which it is formed.

Examples of various epitaxial growth process apparatuses that are suitable for use in forming the graded buffer layer material stack 12 of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

A number of different sources may be used for the deposition of the second semiconductor material that provides each of the semiconductor layers of the graded buffer layer material stack 12. In some embodiments and when the second semiconductor material is composed of a silicon germanium alloy, the source gas for the deposition the second semiconductor material may include an admixture of a silicon containing gas source and a germanium containing gas source. Examples of silicon gas sources include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium gas sources include germane, digermane, halogermane, dichlorogermane, trichlorogermane, tetrachlorogermane and combinations thereof. In some embodiments and when the second semiconductor material is also composed of a silicon germanium alloy, the second semiconductor material can be formed from a source gas that includes a compound containing silicon and germanium. Other source gases or gases mixtures that are known to those skilled in the art can also be used in forming the second semiconductor material. Carrier gases like hydrogen, nitrogen, helium and argon can be used.

A number of different sources may be used for the deposition of the lattice matched epitaxial oxide interlayers of the graded buffer layer material stack 12. In some embodiments and when each of the lattice matched epitaxial oxide interlayers is composed of $(La_xY_{1-x})_2O_3$, the $(La_xY_{1-x})_2O_3$ interlayers are formed by MBE, using La and Y metals with added oxygen. In the present application, a vacuum is typically maintained between the epitaxial growth of the various layers of the graded buffer layer stack 12 of the present application.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:

a graded buffer layer material stack located on a surface of a semiconductor substrate, wherein a lattice matched epitaxial oxide interlayer is disposed between each semiconductor layer of said graded buffer layer material stack and wherein a bottommost semiconductor layer of said graded buffer layer material stack is located directly on said surface of said semiconductor substrate and wherein each semiconductor layer of said graded buffer layer material stack is relaxed and a topmost semiconductor layer of said graded buffer layer material stack contains a lower defect density than other semiconductor layers of said graded buffer layer stack, and wherein threading dislocation defects are present in each semiconductor layer of said graded buffer layer material stack beneath said topmost semiconductor layer, and said threading dislocation defects that are present in each semiconductor layer of said graded buffer layer material stack beneath said topmost semiconductor layer terminate at a bottommost surface of one of said lattice matched oxide interlayers.

2. The semiconductor structure of claim 1, wherein each semiconductor layer of said graded buffer layer material stack is composed of a silicon germanium alloy.

3. The semiconductor structure of claim 2, wherein said graded buffer layer material stack containing said silicon germanium alloy is step graded.

4. The semiconductor structure of claim 1, wherein each semiconductor layer of said graded buffer layer material stack is composed of a III-V compound semiconductor material.

5. The semiconductor structure of claim 4, wherein said graded buffer layer material stack containing said III-V compound semiconductor material is step graded.

6. The semiconductor structure of claim 1, wherein each of said lattice matched epitaxial oxide interlayers is composed of an oxide of at least one rare earth metal.

7. The semiconductor structure of claim 6, wherein said oxide of said at least one rare earth metal is $(La_xY_{1-x})_2O_3$ wherein x is from 0.33 to 0.46.

8. The semiconductor structure of claim 6, wherein said oxide of said at least one rare earth metal is selected from the group consisting of $Gd_2O_3$, $Er_2O_3$, $Dy_2O_3$, $Ho_2O_3$, $Tm_2O_3$, $Lu_2O_3$ and $CeO_2$.

9. The semiconductor structure of claim 1, wherein misfit dislocation defects are present within a bottom portion of each semiconductor layer of said graded buffer layer material stack.

10. A method of forming a semiconductor structure, said method comprising:

forming a graded buffer layer material stack on a surface of a semiconductor substrate, wherein a lattice matched epitaxial oxide interlayer is disposed between each semiconductor layer of said graded buffer layer material stack, and wherein a bottommost semiconductor layer of said graded buffer layer material stack is located directly on said surface of said semiconductor substrate and wherein each semiconductor layer of said graded buffer layer material stack is relaxed and a topmost semiconductor layer of said graded buffer layer material stack contains a lower defect density than other semiconductor layers of said graded buffer layer stack, and wherein threading dislocation defects are present in each semiconductor layer of said graded buffer layer material stack beneath said topmost semiconductor layer, and said threading dislocation defects that are present in each semiconductor layer of said graded buffer layer material stack beneath said topmost semiconductor layer terminate at a bottommost surface of one of said lattice matched oxide interlayers.

11. The method of claim 10, wherein each semiconductor layer of said graded buffer layer material stack is composed of a silicon germanium alloy.

12. The method of claim 11, wherein said graded buffer layer material stack containing said silicon germanium alloy is step graded.

13. The method of claim 10, wherein each semiconductor layer of said graded buffer layer material stack is composed of a III-V compound semiconductor material, and said graded buffer layer material stack containing said III-V compound semiconductor material is step graded.

14. The method of claim 10, wherein each of said lattice matched epitaxial oxide interlayers is composed of an oxide of at least one rare earth metal.

15. The method of claim 14, wherein said oxide of said at least one rare earth metal is $(La_xY_{1-x})_2O_3$ wherein x is from 0.33 to 0.46.

16. The method of claim 14, wherein said oxide of said at least one rare earth metal is selected from the group consisting of $Gd_2O_3$, $Er_2O_3$, $Dy_2O_3$, $Ho_2O_3$, $Tm_2O_3$, $Lu_2O_3$ and $CeO_2$.

17. The method of claim 10, wherein said forming said graded buffer layer material containing said lattice matched oxide interlayers comprises:

epitaxially growing each semiconductor layer and epitaxially growing each lattice matched epitaxial oxide interlayer.

18. The method of claim 10, wherein misfit dislocation defects are present within a bottom portion of each semiconductor layer of said graded buffer layer material stack.

* * * * *